United States Patent [19]
Yoshida et al.

[11] Patent Number: 6,046,529
[45] Date of Patent: Apr. 4, 2000

[54] ELECTRONIC COMPONENT HAVING STRUCTURE FOR PREVENTING SEPARATION AT ADHERED PORTIONS

[75] Inventors: Ryuhei Yoshida; Daisaku Kugo, both of Toyama; Masaya Wajima, Shinminato; Hiroyuki Takahashi, Himi, all of Japan; Satoshi Miura, Schwabach, Germany

[73] Assignee: Murata Manufacturing Co., Ltd., Japan

[21] Appl. No.: 09/066,728

[22] Filed: Apr. 24, 1998

[30] Foreign Application Priority Data

May 7, 1997 [JP] Japan ................................. 9-117023

[51] Int. Cl.⁷ ................................................. H01L 41/08
[52] U.S. Cl. ............................................................. 310/348
[58] Field of Search ....................................... 310/340, 344, 310/348

[56] References Cited

U.S. PATENT DOCUMENTS 5,532,542  7/1996  Yoshida et al. ......................... 310/348
5,585,687  12/1996  Wakabayashi et al. .................. 310/366

FOREIGN PATENT DOCUMENTS 3-097312   4/1991   Japan .
3-247010   11/1991  Japan .
8-148961   6/1996   Japan .
8-148962   6/1996   Japan .

Primary Examiner—Nestor Ramirez
Assistant Examiner—Peter Medley

[57] ABSTRACT

An electronic component is constructed to prevent damage and stripping off or separation at adhered portions thereof even if the component is exposed to abrupt temperature changes to thereby provide a highly reliable component. A piezoelectric vibrating element defining a first substrate and an electronic component case including a pair of substrates which are second substrates are adhered together through an adhesive layer so as to define a closed space. The adhesive layer includes a fillet portion which is arranged to extend along lateral walls of the recess to edges of the closed space to prevent separation at adhesion interface surfaces of the substrates.

20 Claims, 7 Drawing Sheets

ELECTRONIC COMPONENT HAVING STRUCTURE FOR PREVENTING SEPARATION AT ADHERED PORTIONS

BACKGROUND OF THE INVENTION

1. Field of the Invention

This invention relates to electronic components including a plurality of substrates which are joined together via an adhesive and are arranged to have a space defined therebetween, and more particularly, to improved electronic components, for example, a piezoelectric vibrating component which has an improved structure for allowing vibration of the component to be unimpeded and for preventing separation of the substrates at adhered portions thereof.

2. Description of Related Art

Electronic components must be sealed at exterior portions thereof in order to provide a required waterproof quality and resistance to contamination from external affects and debris. In addition, piezoelectric vibrational components and similar devices must be made so as not to prevent a vibrational part from vibrating freely. Such vibrational components are usually provided with a space surrounding a vibrational portion thereof so as to allow for unimpeded vibration and to avoid any hindrance to vibration of the vibrational portion.

One example of a piezoelectric vibrational component having such a space is disclosed in Japanese Laid-open Patent Publication No. H4-4604 and Japanese Laid-open Patent Publication No. H4-35404.

FIG. 9 is a sectional view for explaining one example of a conventional piezoelectric vibrational component. A piezoelectric vibrational device 51 has an energy-trap piezoelectric vibrating element 52 having a plate shape and which utilizes thickness extensional vibration. The piezoelectric vibrating element 52 includes a piezoelectric ceramic plate 52a that is polarized in a thickness direction. The plate 52a has a resonant electrode 52b located on an upper surface thereof and a resonant electrode 52c located on a lower surface thereof so as to be opposite to the resonant electrode 52b. A resonant portion is located at a portion of the piezoelectric ceramic plate 52a which is sandwiched, in a thickness direction, by the resonant electrodes 52b, 52c. The resonant electrodes 52b, 52c extend respectively to end surfaces 52d, 52e of the piezoelectric ceramic plate 52.

The piezoelectric vibrating element 52 has a case substrate 54 adhered via an adhesive 53 onto the upper surface thereof, and a case substrate 56 adhered via an adhesive 55 onto the lower surface thereof. The case substrates 54, 56 respectively have recesses 54a, 56a defined therein. The recesses 54a, 56a are provided in order to define a space which allows the vibration portion of the plate 52a to vibrate freely and without being hindered.

The adhesives 53, 55 are provided to join the case substrates 54, 56 onto the piezoelectric vibrating element 52. If an excessive amount of either or both of the adhesives 53, 55 is used, the adhesive flows into the resonant part of the plate 52a, resulting in deterioration in resonant characteristics and hindering of the vibration of the resonant portion of the plate 52a. Even if the adhesives 54, 56 do not contact the resonant part of the plate 52a, if excessive amounts of the adhesives 53, 55 are provided on a vibration energy attenuating portion of the plate 52a located near the resonant part, deterioration in resonant characteristics occurs.

Consequently, the amount of adhesives 53, 55 applied is hoped to be sufficient for adhesion only while preventing the adhesives 53, 55 from reaching or extending along the plate 52a into the recesses 54a, 56a. However, since pressure is exerted after applying adhesives 53, 55 to achieve sufficient adhesion, the adhesive 53 and the adhesive 55 partially flow along the plate 52a into the recess 54a and into the recess 56a, respectively, and are thereafter cured. To avoid the affect of such adhesive 53, 55 in the recesses 54a, 56a, the amount of adhesive 53, 55 has been controlled such that the adhesive 53, 55 is applied only to a portion of an adhesion interface surface of the case substrates 54, 56. That is, the adhesive 53, 55 is applied in an amount and manner that the adhesive does not cover an entire adhesion interface surface but as seen in FIG. 9, only covers a portion of the substrates 54, 56 which are to be joined to the plate 52a via the adhesives 53, 55.

The piezoelectric substrate 52a constituting the piezoelectric vibrating element 52 and the case substrates 54, 56 are made of different materials and therefore, have different thermal expansion coefficients. As a result, when the piezoelectric vibrational component 51 is exposed to temperature changes, the adhered portions at locations of the adhesives 53, 55 experience stress due to the difference of thermal expansion coefficients between the material used to form the plate 52a and the material used to form the substrates 54, 56. The stresses are applied in a shearing direction as shown by the arrow A in FIG. 9. Further, the stresses concentrate at a portion shown by the arrow B, i.e. at an edge portion of an adhesion interface surface between the horizontally extending adhesion surface 54b of the case substrate 54 and the adhesive 53. This stress concentration may also occur at the end at an edge portion of an adhesion interface surface between the horizontally extending adhesion surface 56b of the case substrate 56 and the adhesive 55.

If abrupt temperature changes occur, stripping or peeling of the adhesive 53, 55 from the substrates 54, 56 and the plate 52a occurs at a stress concentration location shown by the arrow B, which results in deterioration of the waterproof quality and resistance to external factors and contamination.

SUMMARY OF THE INVENTION

To overcome the problems described above, the preferred embodiments of the present invention provide an electronic component which includes a plurality of substrate members joined to each other via an adhesive so as to define a closed space, wherein peeling off or removal of the adhesive from the substrate members is prevented to thereby ensure maximum waterproof quality and resistance to external factors and contamination.

The preferred embodiments of the present invention provide an electronic component including a first substrate and a second substrate, a recess having a lateral wall provided on at least one of the first and second substrates, an adhesive layer connecting the first and second substrates together at peripheral portions of the recess, a space defined between the first and second substrates, and the adhesive layer has a fillet portion which extends along the lateral wall of the recess.

In the structure described above according to preferred embodiments of the present invention, the adhesive layer preferably has a fillet portion which extends along the lateral wall of the space. Consequently, if abrupt temperature changes occur during curing of the adhesive or during the use of the electronic component, the adhesion portion is prevented from stripping off or peeling off of the substrates because the fillet portion covers the lateral wall. As a result, the electronic component has excellent reliability and retains its waterproof quality and resistance to external factors during its entire useful life.

In the present invention, various forms, structures and electronic elements can be considered as the structure having the first and second substrates which are adhered through an adhesive so as to define the space therebetween.

In the above-described electronic component, the first substrate may be a plate-shaped electronic component element and the recess may be provided in the second substrate.

As a result of structure described above with reference to preferred embodiments of the present invention, the space is defined by the recess and therefore, the adhesive layer has the fillet portion. As a result of the provision of the fillet portion, stripping off or peeling off of the adhesive and separation will not occur at the adhered portion around the closed space defined partially by the recess.

Further, the plate-shaped substrate may comprise a piezoelectric vibrating element having a vibrating portion, and the recess provided on the second substrate may define the space which allows for completely free and unhindered vibration of the vibrating portion.

With the above-described structure, the adhered portion will be prevented from being stripped off or peeled off because of the presence of the fillet portion of the adhesive layer to thereby provide a piezoelectric vibrating device such as a piezoelectric resonator and a piezoelectric filter that has excellent reliability.

The above described electronic component may further include a third substrate having a recess at a lower surface thereof, the third substrate being adhered to an upper surface of the piezoelectric vibrating element.

With the above structure, it is possible to provide a piezoelectric vibrating component that achieves completely free and unimpeded vibration while also providing excellent reliability and resistance to external conditions because peeling or stripping off of the adhesive connecting the elements of the component and separation and adhered portions are reliably prevented despite extreme temperature changes.

Other features and advantages of the present invention will become apparent from the following description of preferred embodiments of the present invention which refers to the accompanying drawings.

BRIEF DESCRIPTION OF THE INVENTION

Figure 5A:
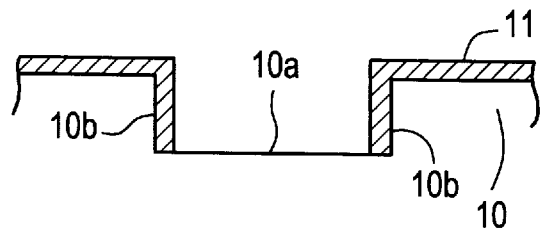
Figure 5B:
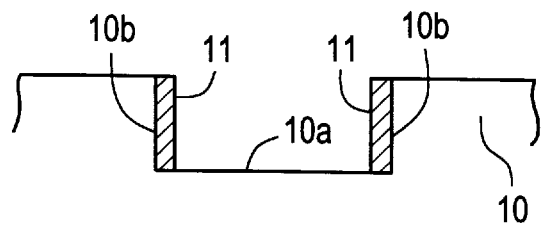
Figure 5C:
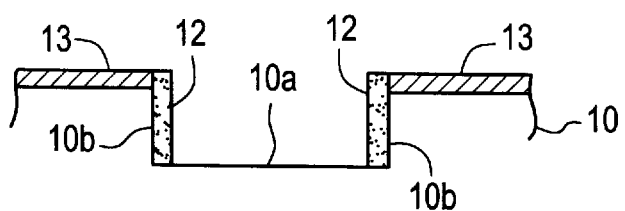
Figure 6:
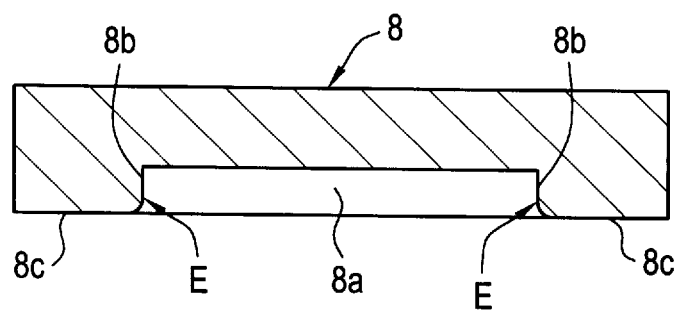
Figure 7:
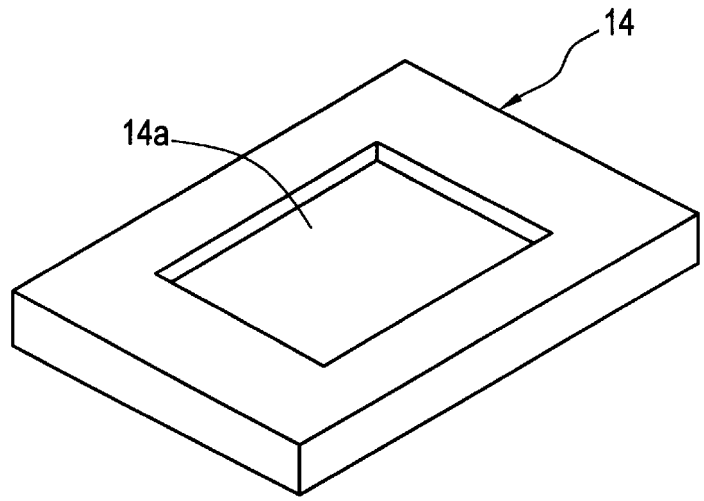
Figure 8A:
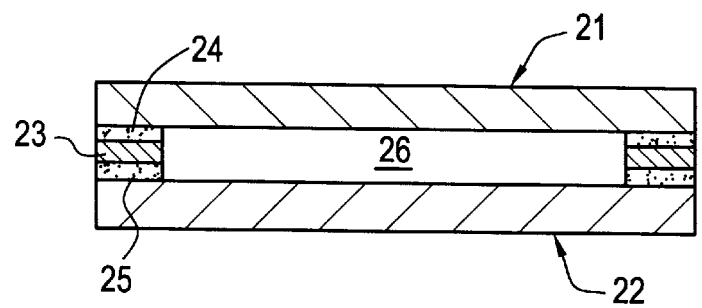
Figure 8B:
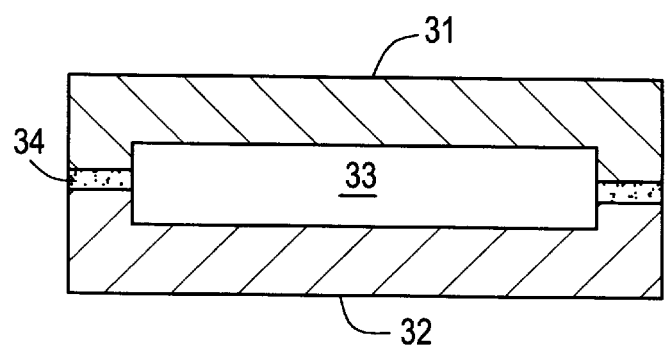
Figure 9:
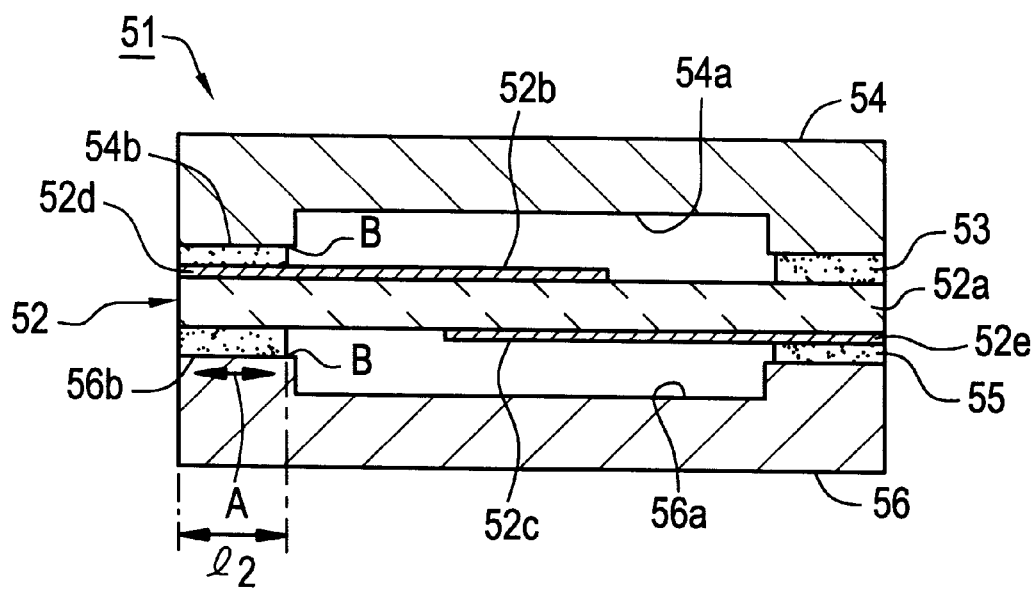

FIGS. 5(a), 5(b) and 5(c) are partial cut-away sectional views showing examples provided with coating layers for providing an adhesive fillet portion in a recess;

FIG. 6 is a sectional view for explaining a modification having a rounded portion located at an interface between a recess-lateral wall and a horizontal adhesion surface;

FIG. 7 is a perspective view of a case substrate for explaining another form of the recess;

FIGS. 8(a) and 8(b) are sectional views for explaining another modification of an electronic component of preferred embodiments of the present invention; and FIG. 9 is a sectional view showing one example of a conventional piezoelectric resonant component.

DETAILED DESCRIPTION OF PREFERRED EMBODIMENTS

Figure 1:
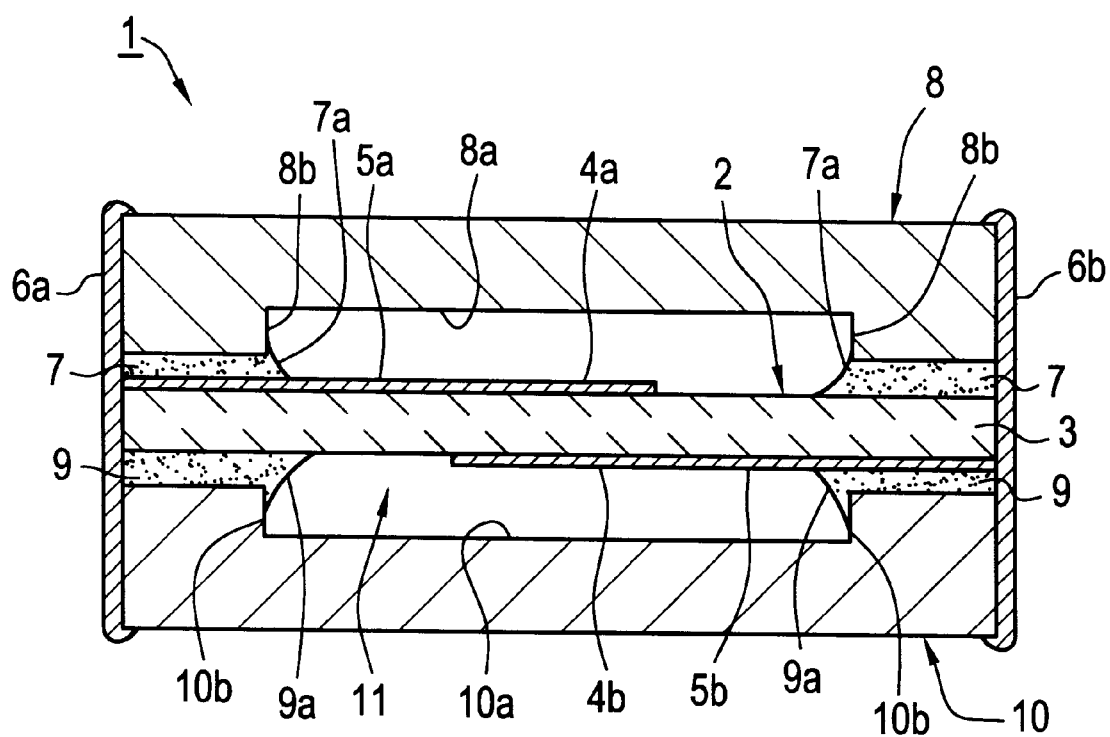
FIG. 1 is a sectional view showing a piezoelectric resonant component according to a preferred embodiment of the present invention.
Figure 2:
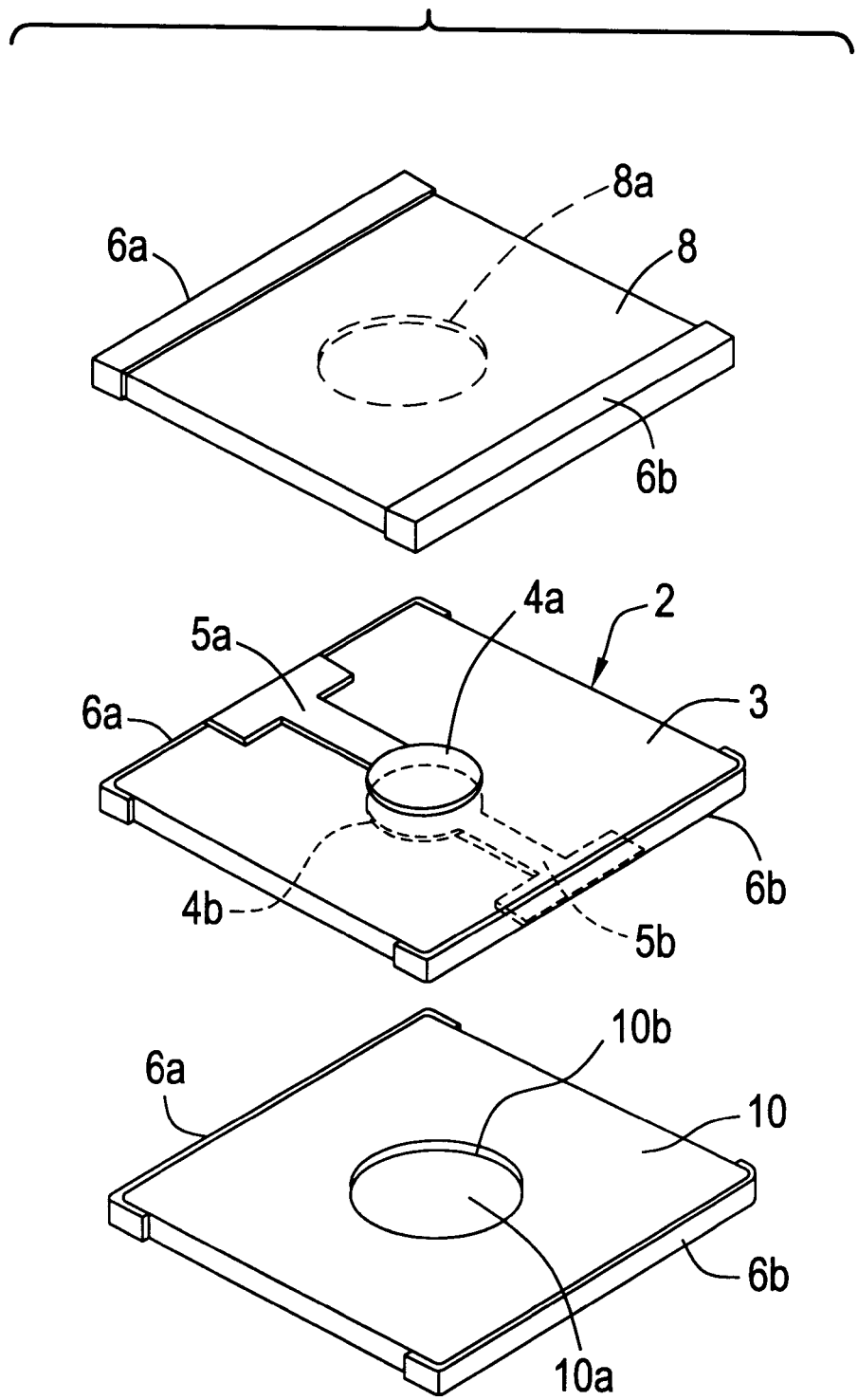
FIG. 2 is an exploded perspective view of the piezoelectric resonant component shown in FIG. 1.

Referring to FIG. 1, there is illustrated a sectional view of an energy-trap piezoelectric resonant device according to a first preferred embodiment of the present invention. FIG. 2 is an exploded perspective view of the same device shown in FIG. 1.

A piezoelectric resonant device 1 preferably has an energy-trap piezoelectric resonator 2 defining a piezoelectric vibrating element thereof. The piezoelectric resonator 2 has a piezoelectric substrate 3 preferably formed of a piezoelectric ceramic such as a titanium zirconate lead-based piezoelectric ceramic. The piezoelectric substrate 3 is preferably polarized in a thickness direction thereof.

As shown in FIG. 2, the piezoelectric substrate 2 has a resonant electrode 4a which is preferably substantially circular and is preferably located at an approximate center on the upper surface thereof. Also, a resonant electrode 4b is located on the lower surface of the substrate 2 and preferably is arranged opposite to the resonant electrode 4a. The resonant electrodes 4a, 4b extend to opposite edges of the piezoelectric substrate 3 via respective connecting conductor portions 5a, 5b.

The piezoelectric resonant device 1 preferably has outer metallized portions 6a, 6b located at respective end surfaces thereof. The outer metallized portion 6a is electrically connected with the connecting conductor portion 5a and the outer metallized portion 6b is electrically connected with the connecting conductor portion 5b.

The piezoelectric resonator 2 operates as an energy-trap piezoelectric resonator utilizing a thickness extensional vibration mode upon receiving an alternate-current voltage between the resonant electrodes 4a, 4b. In this case, vibration energy generated thereby is trapped at a resonant portion, i.e. the portion of the piezoelectric ceramic plate 3 which is sandwiched between the resonant electrode 4a and the resonant electrode 4b.

A case substrate 8 is adhered to the upper surface of the piezoelectric resonator 2 via an adhesive layer 7, while a case substrate 10 is adhered to the lower surface via an adhesive layer 9.

The case substrate 8 has a recess 8a located at a lower surface thereof, while the case substrate 10 has a recess 10a located at its upper surface. The recesses 8a, 10a are provided to define a space 11 for allowing the resonant portion of the piezoelectric ceramic plate 3 to vibrate freely and completely unimpeded.

The adhesive layers 7, 9 are preferably arranged to define a substantially rectangular frame so that the space 11 is a closed space. In preferred embodiments of the present invention, the closed space is preferably hermetically sealed in order to enhance its waterproof quality and resistance to external conditions and debris. However, the component does not necessarily require hermetic sealing but may be partly open while still defining a "closed space" in some regions therein.

The case members 8, 10 respectively constitute second and third substrates. Although the material of the case substrates 8, 10 is not limited, it is preferred if the materials used to form the substrates 8, 10 are, for example, insulating ceramics, such a alumina, synthetic resin, or other such suitable materials.

The adhesive layers 7, 9 may be preferably formed of an appropriate adhesive such as an epoxy-based resin and silicone-based adhesive.

The preferred embodiments of the present invention include fillet portions 7a, 9a which are part of the adhesive layers 7, 9. The fillet portions 7a, 9a preferably extend along lateral walls of the space 11, i.e. lateral walls 8b, 10b of the recesses 8a, 10a. The lateral walls 8b, 10b of the recesses 8a, 10a are arranged to be substantially perpendicular to the piezoelectric ceramic plate 3 as seen in FIG. 1.

The fillet portions 7a, 9a are defined by portions of the adhesive layer 7, 9 which exist within the recesses 8a, 10a and which extend along the lateral wall 8b, 10b. More specifically, as can be seen by a comparison of the conventional structure shown in FIG. 9 and the structure of preferred embodiments of the present invention shown in FIG. 1, the adhesives 7, 9 are arranged to extend along an entire interface adhesion surface of the substrates 8, 10 and also along lateral walls 8b, 10b of the substrates 8, 10 whereas in the conventional structure, the adhesive extended only along a partial portion of the interface adhesion surface between the substrates and did not contact any portion of lateral walls of the substrates.

The fillet portions 7a, 9a can be formed by controlling the amount of adhesive applied and the amount of pressure applied onto the case substrates 8, 10 when adhering substrates 8, 10 via the adhesive layers 7, 9.

The piezoelectric resonant device 1 according to preferred embodiments of the present invention will not experience stripping or peeling off at the adhered portion because of the presence of fillet portions 7a, 9a, even if the device 1 is exposed to abrupt temperature changes. This phenomenon will be explained with reference to FIG. 3 and FIG. 4.

Figure 3:
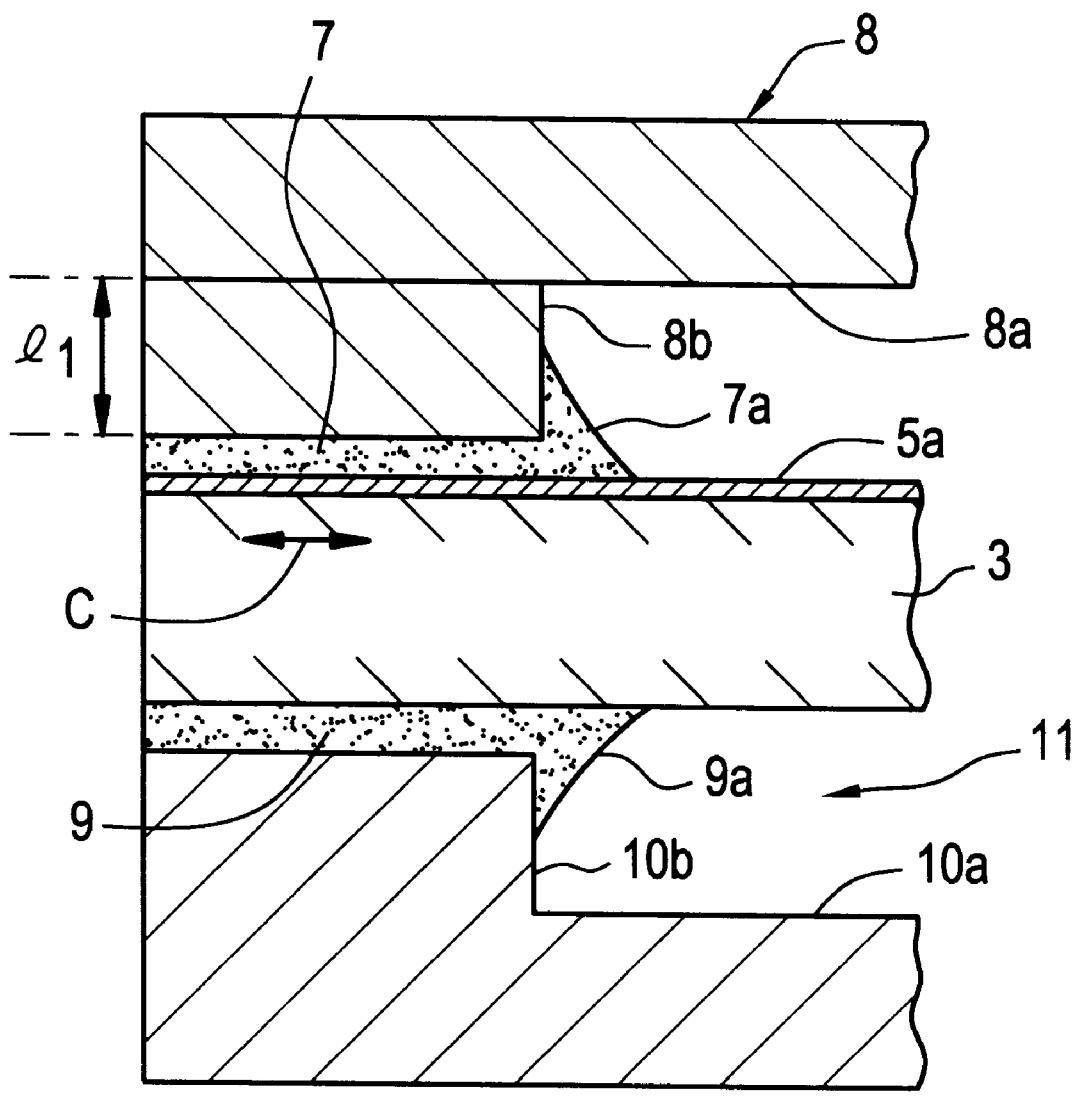
FIG. 3 is a partially cut-away magnified sectional view for explaining an essential part of the piezoelectric resonant component shown in FIG. 1.

As shown by the magnified view in FIG. 3, the fillet portion 7a is provided when forming the adhesive layer 7. Stresses are applied in a shearing direction (shown by the arrow C) similarly to the conventional example. However, although the stresses act in the shearing direction as shown by the arrow C in FIG. 3, the fillet portion 7a covers a portion of the lateral wall 8b of the recess 8a which has a distance $l_1$ in FIG. 3, thereby effectively preventing the adhered surfaces from stripping off or peeling off. The same is true for the fillet portion 9a covering a portion of the lateral wall 10b of the recess 10a to prevent the adhered surfaces from stripping or being separated. That is, since the adhered surfaces are also present and extend along a direction transverse to the direction of application of the stresses as a result of the presence of the fillets 7a, 9a, it is possible to sufficiently resist the stresses acting in the shearing direction to thereby prevent the adhered surfaces from being stripped off or separated.

Consequently, when the piezoelectric resonant device 1 experiences abrupt and drastic temperature changes, even if stresses are applied in the shearing direction as a result of differences in thermal expansion coefficients of the piezoelectric resonator 2 and the case substrate 8, 10, the fillet portions 7a, 9b absorb such stresses and thereby prevent the adhered surfaces from stripping or being separated.

Figure 4:
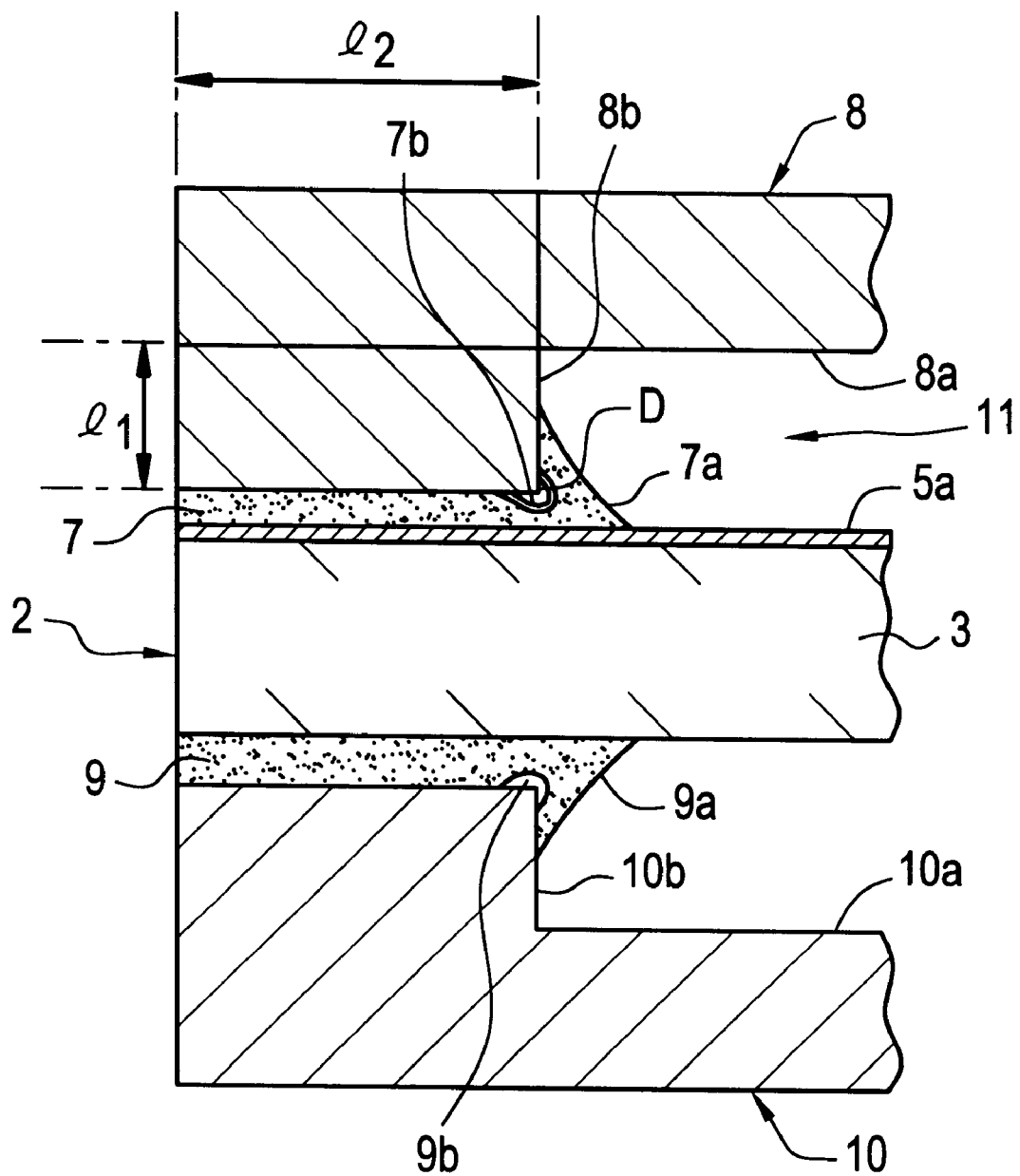
FIG. 4 is a partially cut-away magnified sectional view showing an adhered portion of the piezoelectric resonant component in a preferred embodiment in which a void occurred during curing.

In addition, even if a void 7b, 9b occurs due to contraction of the adhesive upon curing of the adhesive layers 7, 9 or a concentration of stresses at the corner as shown by the arrow D in FIG. 4, the sealability can be maintained. For example, since the portion of the adhesive layer 7 located above the void 7b adheres to the lateral wall 8b of the recess 8a, the sealability for the space 11 is reliably maintained.

Further, a path through which leaking of air or the like occurs between the inside and outside of the space 11, i.e. a leak path, in the conventional example shown in FIG. 9 has a length of as short as $l_2$ along an adhesion surface 54a. In contrast, the present example of preferred embodiments of the present invention has a leak path having an additional length of $l_1$ extending along the lateral wall 8b of the recess 8a as well as the length $l_2$ extending along the inner surface of the case substrate 8. By locating adhesive along this increased leak path, more adhesive is provided and the presence of adhesive along this additional adhesion surface prevents leaking from occurring through the leak path, thereby providing increased reliability of the piezoelectric resonant device 1.

Preferably, the surface of the lateral walls 8b, 10b of the recesses 8a, 10a is smoother as compared to the surrounding areas thereof, in order to facilitate the formation of the fillet portions 7a, 9a. The smoothness of the lateral walls 8b, 10b as compared to that of the other adhered surfaces makes it easier for the adhesive to flow over the lateral walls 8b, 10b, to thereby easily provide the fillet portions 7a, 9a.

The surface roughness can be controlled by smoothing the surfaces on the side that the recesses 8a, 10a are formed in the case substrates 8, 10. For example, using a lap grinding process, the surface smoothness can readily be controlled by using the different grit size to provide increased surface smoothness to the lateral walls 8b, 10b as compared to other portions of the walls of the recesses.

Explanations will be further made of other methods for forming the fillet portions 7a, 9a with reference to FIGS. 5(a), 5(b) and 5(c).

FIG. 5(a) shows a schematic sectional view of a part of the lateral walls 10b in the recess 10a of the case substrate 10, wherein a coating layer 11 is disposed on the recess lateral walls 10b and the surrounding area of the case substrate 10. the coating layer 11 preferably is formed of a material having a wettability higher than that of the case substrate 10. Thus, by forming the coating layer 11 having high wettability for the adhesive over the lateral wall 10b, it is possible to reliably provide an adhesive layer 9 which extends to the lateral wall 10b. Thus, the fillet portion 9b is reliably and easily formed.

Alternatively, the coating layer 11 may be provided only on the lateral wall 10b as shown in FIG. 5(b). Also in this case, the adhesive is able to readily flow over the lateral wall 10b so as lo reliably and easily provide a fillet portion 9b.

It also possible, as shown in FIG. 5(c) to form a coating layer 12 having a relatively high wettability for the adhesive on the lateral wall 10b, and a coating layer 13 that is lower in wettability than that of the coating layer 12 on an peripheral adhesion surface of the recess 10a.

The material used for the above-stated coating layer 11–13 is not limited. It is possible to use an appropriate resin, e.g. an epoxy resin, that has controllable wettability for an adhesive applied. In addition, a metal foil or metal thin film may be used.

FIG. 6 is a sectional view for explaining another preferred embodiment of a method of providing fillet portions 7a, 9a of the adhesive layer 7, 9. In this preferred embodiment, a rounded portion is provided along an opening line of the recess 8a in the case substrate 8. That is, the rounded portion is made, as shown by the arrows E, at an end edge between the lateral wall 8b and the adhesion surface 8c horizontally extending therefrom. By thus rounding the end edge connecting the adhesion surface 8c and the lateral wall 8b, the adhesive will not gather at the rounded portion. Accordingly, the adhesive easily rises onto the lateral wall 8b, thereby facilitating fillet portion formation.

The method of rounding the end edge between the adhesion surface 8c and the lateral wall 8b is not limited to the above, but can be easily carried out by such processes as barrel polishing and sand blasting.

The above-described modifications preferred for forming the fillet portion may be appropriately combined with each other. By doing so, it is possible to positively form the fillet portion with increased ease.

Although in the preferred embodiment shown in FIG. 1 the case substrates 8, 10 were formed therein with respective circular recesses 8a, 10a, the shape of the recess 8a, 10a is not limited. Alternatively, a case substrate 14 that has a substantially rectangular recess 14a as shown in FIG. 7 may be used.

Further, the electronic component according to preferred embodiments of the present invention is not limited to the structure shown in FIG. 1 in which the case substrates 8, 10 are disposed on the piezoelectric resonator 2. For example, the structure may be such that the first and second members 21, 22 having a plate shape are adhered to each other via a spacer 23 by using adhesive layers 24, 25, as shown in FIG. 8(a). In this case, a closed space is internally defined by the thickness of the spacer 23 and the adhesive layers 24, 25. Alternatively, the space may be similarly provided by increasing the thickness of the adhesive layers without using the spacer 23.

Otherwise, the structure may be as shown in FIG. 8(b), wherein first and second members 31, 32 having respective recesses 31a, 32a are adhered to each other using an adhesive layer 34 such that a closed space 33 is defined by the recesses 31a, 32a.

With the electronic components as shown in FIGS. 8(a) and 8(b), it is possible to reliably prevent strip-off or separation at an adhered portion similarly to the piezoelectric resonant device 1 according to the first preferred embodiment, by providing an adhesive fillet portion in the adhesive layer 24, 25, 34 such that the fillet portion is located at the lateral wall defining the space. An electronic component having excellent reliability can thereby be provided.

The present invention is not limited to piezoelectric vibrating components such as piezoelectric resonators and piezoelectric filters. Instead, the present invention is applicable generally to electronic components that have a plurality of members adhered using an adhesive to define a closed space.

While the invention has been particularly shown and described with reference to preferred embodiments thereof, it will be understood by those skilled man in the art that the forgoing and other changes in form and details may be made therein without departing from the spirit of the invention.

What is claimed is:

1. An electronic component comprising:

a first substrate;

a second substrate having a substantially U-shaped configuration including a recess located along a central portion thereof and having lateral walls and a recessed longitudinal surface between the lateral walls, the recess defining a vibration space between the first and second substrates in which a portion of said first substrate can move relative to said second substrate;

an adhesive layer joining said first and second substrates together at peripheral portions of said recess; and said adhesive layer having at least one fillet portion extending along a portion of at least one of said lateral walls of said recess without contacting the longitudinal surface between the lateral walls.

2. An electronic component according to claim 1, wherein said first substrate is a plate-shaped electronic component element and said recess is provided on said second substrate.

3. An electronic component according to claim 2, wherein said plate-shaped substrate is a piezoelectric vibrating element having a vibrating portion, and said recess provided on said second substrate defines said space which allows said vibrating portion to vibrate freely.

4. An electronic component according to claim 3, further comprising a third substrate having a recess at a lower surface thereof, said third substrate being joined to an upper surface of said piezoelectric vibrating element.

5. An electronic component according to claim 1, wherein said lateral wall is substantially perpendicular to a length of said first substrate and a length of said second substrate.

6. An electronic component according to claim 1, wherein said adhesive layer is located along a first horizontal surface of at least one of said first and second substrates and along a second vertical surface of said at least one of said first and second substrates which is a portion of said lateral wall.

7. An electronic component according to claim 1, wherein a surface of the lateral wall is smoother than other portions of said first and second substrates.

8. An electronic component according to claim 1, wherein the recess includes a rounded portion located where the lateral wall is joined to an adjacent horizontal wall of the recess.

9. An electronic component according to claim 1, further comprising a coating layer provided between the at least one fillet portion and the lateral wall.

10. An electronic component comprising:

a first substrate;

a second substrate joined to the first substrate along an adhesion interface surface, the second substrate having a substantially U-shaped configuration including a recess located along a central portion thereof and having lateral walls and a recessed longitudinal surface between the lateral walls, the recess defining a vibration space between the first and second substrates in which a portion of said first substrate can move relative to said second substrate;

an adhesive layer located along an entire portion of the adhesion interface surface and along a portion of said lateral walls extending from the adhesion interface surface without contacting the longitudinal surface between the lateral walls to join said first and second substrates to each other.

11. An electronic component according to claim 10, wherein said adhesive layer has at least one fillet portion extending along said lateral wall of said recess.

12. An electronic component according to claim 10, further comprising a vibrating element located between the first and second substrates and in contact with said adhesive layer.

13. An electronic component according to claim 10, wherein said first substrate is a plate-shaped electronic component element and a recess is provided on said second substrate.

14. An electronic component according to claim 13, wherein said plate-shaped substrate is a piezoelectric vibrating element having a vibrating portion, and said recess provided on said second substrate defines said space which allows said vibrating portion to vibrate freely.

15. An electronic component according to claim 14, further comprising a third substrate having a recess at a lower surface thereof, said third substrate being joined to an upper surface of said piezoelectric vibrating element.

16. An electronic component according to claim 10, wherein said lateral wall is substantially perpendicular to a length of said first substrate and a length of said second substrate.

17. An electronic component according to claim 10, wherein said adhesive layer is located along a first horizontal surface of at least one of said first and second substrates and along a second vertical surface of said at least one of said first and second substrates which is a portion of said lateral wall.

18. An electronic component according to claim 10, wherein a surface of the lateral wall is smoother than other portions of said first and second substrates.

19. An electronic component according to claim 10, wherein a rounded portion is located where the lateral wall is joined to an adjacent horizontal wall of the adhesion interface surface.

20. An electronic component according to claim 10, further comprising a coating layer provided along the lateral wall extending from the adhesion interface surface.

* * * * *